(12) United States Patent
Yu

(10) Patent No.: US 7,473,522 B2
(45) Date of Patent: Jan. 6, 2009

(54) METHOD FOR MANUFACTURING MICRO-LENSES OF IMAGE SENSORS

(75) Inventor: Cheng-Hung Yu, Kao-Hsiung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/754,364

(22) Filed: May 28, 2007

(65) Prior Publication Data

US 2008/0299498 A1 Dec. 4, 2008

(51) Int. Cl.
*G02B 3/00* (2006.01)

(52) U.S. Cl. ........................ 430/321; 430/330
(58) Field of Classification Search ........................ None
See application file for complete search history.

(56) References Cited

U.S. PATENT DOCUMENTS 6,734,031 B2   5/2004   Shizukuishi

2003/0111700 A1   6/2003   Bencuya
2004/0033640 A1   2/2004   Izumi et al.
2005/0280012 A1   12/2005   Boettiger et al.
2006/0023312 A1*   2/2006   Boettiger et al. ............ 359/619
2006/0119950 A1   6/2006   Boettiger et al.

FOREIGN PATENT DOCUMENTS

JP   3-152973 A   *   6/1991
JP   4-229803 A   *   8/1992

* cited by examiner

*Primary Examiner*—John A. McPherson
(74) *Attorney, Agent, or Firm*—Winston Hsu

(57) ABSTRACT

A method for manufacturing micro-lenses of image sensors includes providing a semiconductor substrate having at least a planarization layer, performing a first photolithography process to form a first set of micro-lens blocks on the planarization layer, performing a first baking process to form a first set of micro-lenses, performing a first surface treatment to harden surfaces of the first set of micro-lenses, performing a second photolithography to form a second set of micro-lens blocks on the planarization layer, and performing a second baking process to form a second set of micro-lenses.

28 Claims, 19 Drawing Sheets

METHOD FOR MANUFACTURING MICRO-LENSES OF IMAGE SENSORS

BACKGROUND OF THE INVENTION

1. Field of the Invention

The present invention relates to methods for manufacturing micro-lenses of image sensors, and more particularly, to methods for manufacturing micro-lenses in array.

2. Description of the Prior Art

As the development of electronic products such as digital cameras and scanners progresses, the demand for image sensors increases accordingly. In general, image sensors in common usage nowadays are divided into two main categories: charge coupled device (CCD) sensors and CMOS image sensors (CIS). The use of micro-lenses significantly improves the photosensitivity of the image sensors by collecting light from a large light collecting area and focusing it onto a small photosensitive area such as a photodiode.

Please refer to FIGS. 1-3, which are schematic drawings illustrating a conventional method for manufacturing micro-lenses array. As shown in FIG. 1, a semiconductor substrate 10 including photosensitive regions 12 and image sensors such as CCD or CMOS image sensors is provided. Then a transparent dielectric layer 16, a color filter array (CFA) 18, and a transparent planarization layer 20 are sequentially formed on the semiconductor substrate 10. Each color filter unit of the CFA 18 corresponds to one photosensitive region 12. Then, a micro-lens material layer 30 composed of photoresist is formed on the planarization layer 20.

Please refer to FIGS. 2-3. Next, a conventional photolithography process is performed to pattern the micro-lens material layer 30 and to form an array 34 composed of a plurality of micro-lens blocks 32. Each micro-lens block 32 corresponds to one color filter unit and one photosensitive region 12. Then, a baking process is performed to melt and re-shape the micro-lens blocks 32 and to form micro-lenses 36 in array as shown in FIG. 3. Gaps 40 between each micro-lens 36 approximately are equal to widths of the image sensors 14.

Along with improvements in resolution and decreases in sizes of pixel and image sensor 14, requirements of zero-gap to the micro-lenses 36 emerges. However, according to the conventional method for manufacturing micro-lenses, the smaller gap 40 causes two adjacent micro-lenses 36 to overlap, and thus a bridge is formed between said two adjacent micro-lenses 36. In other words, the conventional method fails to provide zero-gap micro-lenses. Therefore, methods are provided by those skilled in the art to solve such problem. Please refer to FIG. 4, which is a set of checkerboard photomasks 50 and 52 having corresponding micro-lens patterns provided US. Patent Application Publication No. US 2003/0111770 A1. The checkerboard photomasks are provided to satisfy the requirement of zero-gap. Please refer to FIGS. 5-6. The checkerboard photomask 50 is used to pattern a micro-lens material layer (not shown) and to form a first set of micro-lens blocks 60. Then a first baking process is performed to form a first set of micro-lenses 62 as shown in FIG. 6. Please refer to FIGS. 7-8. Then the corresponding checkerboard photomask 52 is used to pattern another micro-lens material layer (not shown) and to form a second set of micro-lens blocks 64. Then a second baking process is performed to form a second set of micro-lenses 62 as shown in FIG. 8. Thus formation processes of a zero-gap micro-lenses array is completed.

However, the checkerboard photomasks 52 and 52 are high grade photomasks having slight and precise micro-lens patterns, therefore consideration of increasing cost and increasing possibility of failure in exposure, development, and etching processes is raised. More important, though the zero-gap micro-lenses array comprising the first set of micro-lenses 62 and the second set of micro-lenses 66 is obtained, influence on the first set of micro-lenses 62 during the second baking process cannot be completely prevented. Therefore bridge 68 still would be formed between the first set of micro-lenses 62 and the second set of micro-lenses 66 as shown in FIG. 8. In order to avoid said bridge, another approach is provided to form a zero-gap micro-lens array with three steps of forming the micro-lens material layer, three photolithography processes and three baking process with different temperatures. Such method is much more complicated, and still cannot completely prevent one set of micro-lenses from influence caused in other baking process which leads to forming the bridge. Therefore, a method that not only simplifies the whole process but also improves the result of formation of the micro-lenses is needed.

SUMMARY OF THE INVENTION

Therefore the present invention provides methods for manufacturing micro-lenses of image sensors to simplify the process and improve the result of formation of the micro-lenses.

According to the claimed invention, a method for manufacturing micro-lenses of image sensors is provided. The method comprises steps of providing a semiconductor substrate having at least a planarization layer, performing a first photolithography process to form a first set of micro-lens blocks on the planarization layer, performing a first baking process to form a first set of micro-lenses on the planarization layer, performing a first surface treatment to harden surfaces of the first set of micro-lenses, performing a second photolithography process to form a second set of micro-lens blocks on the planarization layer, and performing a second baking process to form a second set of micro-lenses.

According to the claimed invention, another method for manufacturing micro-lenses of image sensors is provided. The method comprises steps of providing a semiconductor substrate having at least a planarization layer, performing a first photolithography process to form a first set of micro-lens blocks with a first chessboard photomask on the planarization layer, performing a first baking process to form a first set of micro-lenses on the planarization layer, performing a surface treatment to harden surfaces of the first set of micro-lenses, performing a second photolithography process to form a second set of micro-lens blocks with the first chessboard photomask shifted one pitch, and performing a second baking process to form a second set of micro-lenses on the planarization layer.

According to the method provided by the present invention, the micro-lenses are formed set by set; therefore a zero-gap micro-lenses array is obtained. And a surface treatment is performed to harden the surfaces of the first set of micro-lenses after the first baking process, therefore the first set of micro-lenses is protected from influence caused in following processes for forming the second set of micro-lenses. Thus bridges formed in between the first set of micro-lenses and the second set of micro-lenses are completely avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
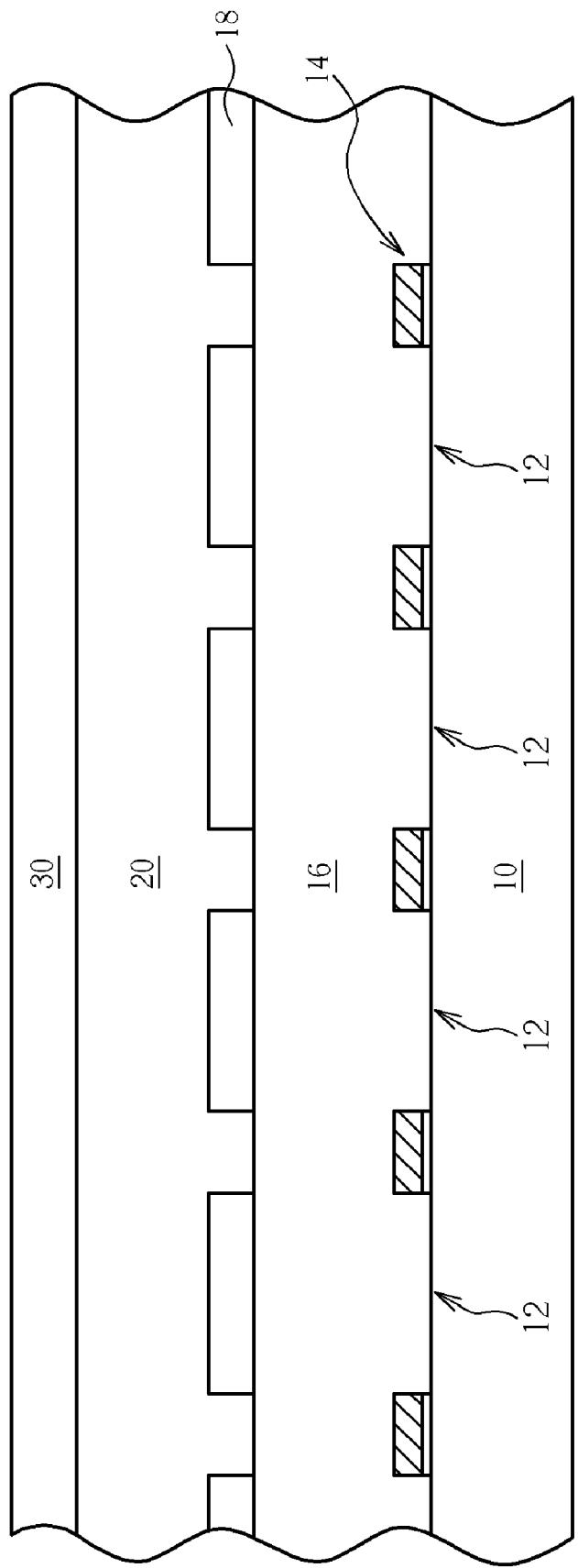
FIGS. 1-3 are schematic drawings illustrating a conventional method for manufacturing micro-lenses array.
Figure 2:
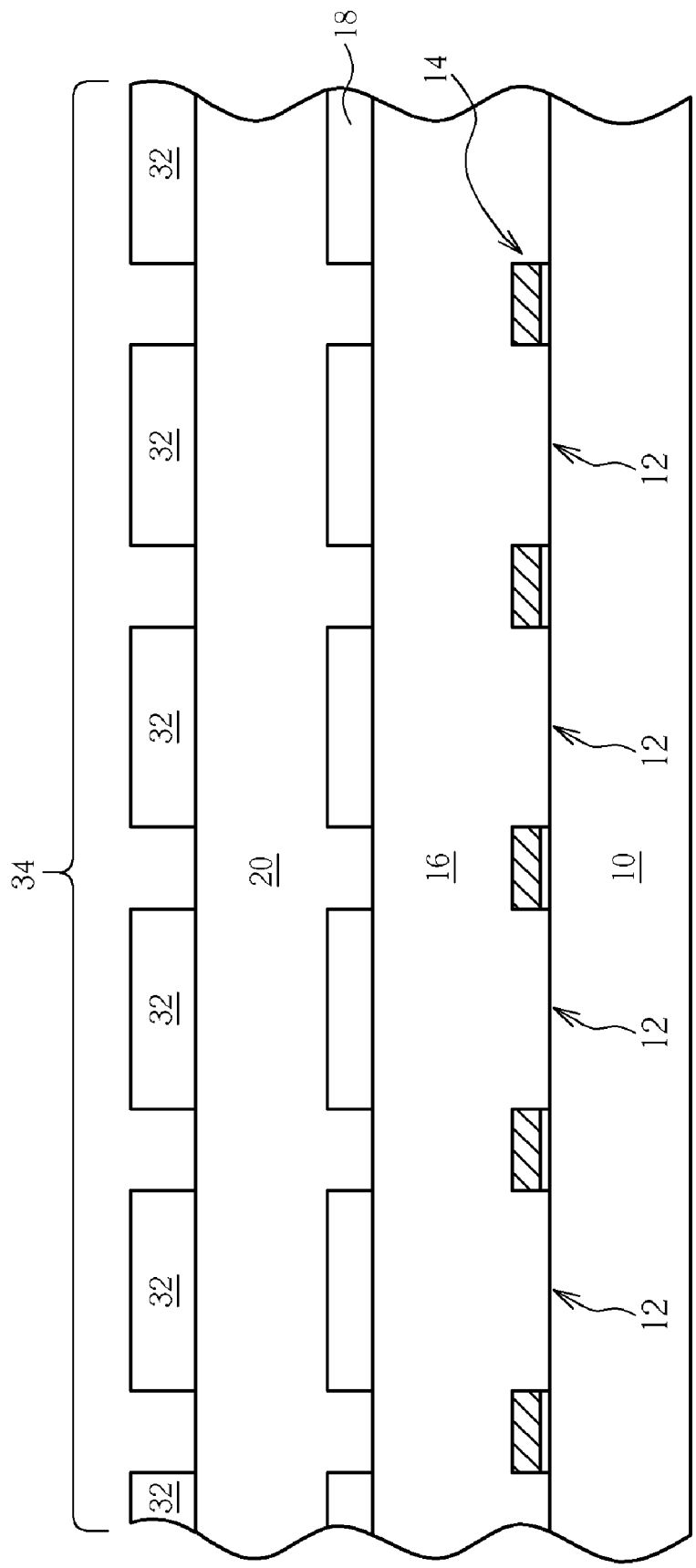
Figure 3:
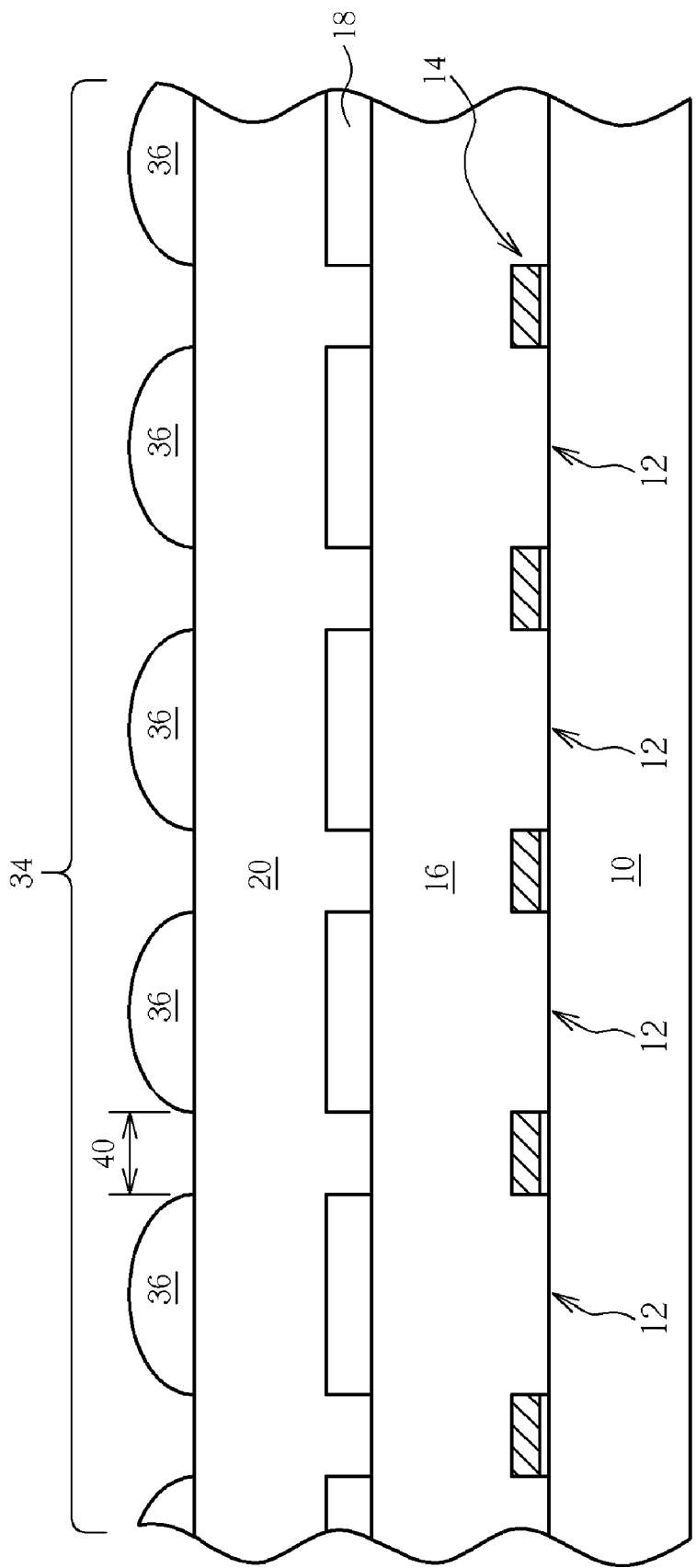
Figure 4:
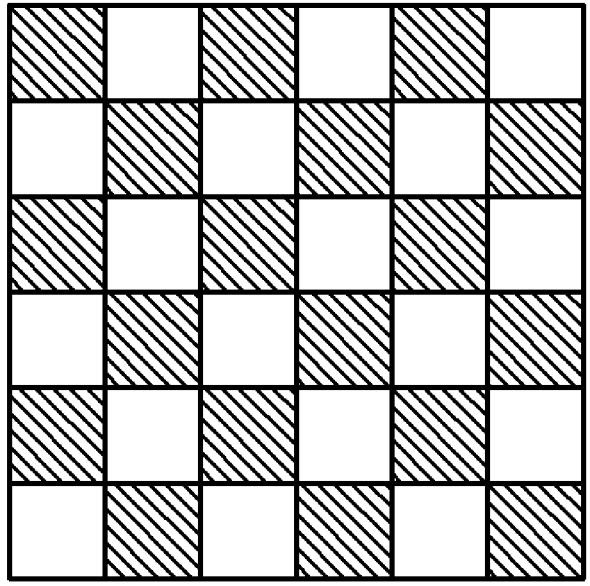
FIG. 4 is a set of checkerboard photomasks having corresponding micro-lens patterns provided by US. Patent Application Publication No. US 2003/0111770 A1.
Figure 4:
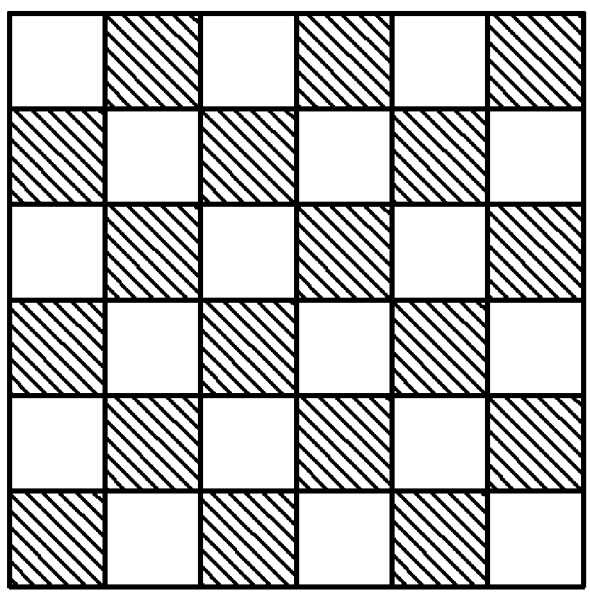
Figure 5:
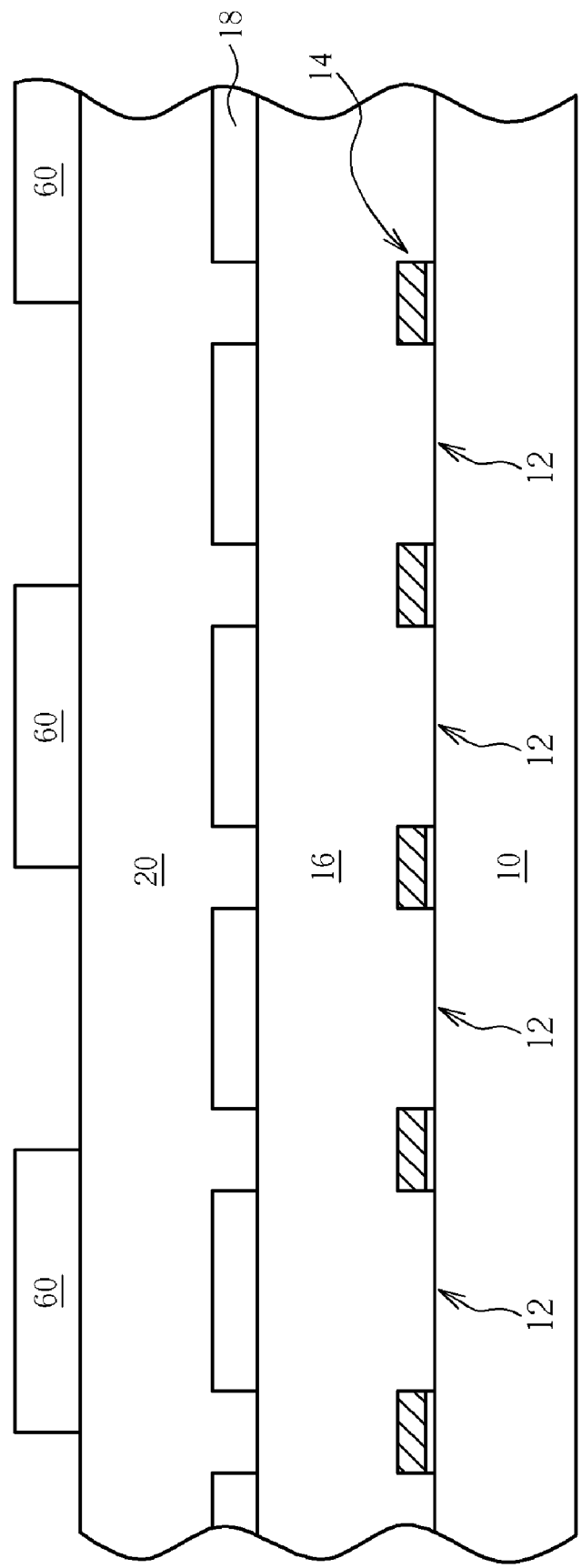
FIGS. 5-8 are schematic drawings illustrating another conventional method for manufacturing micro-lenses array.
Figure 6:
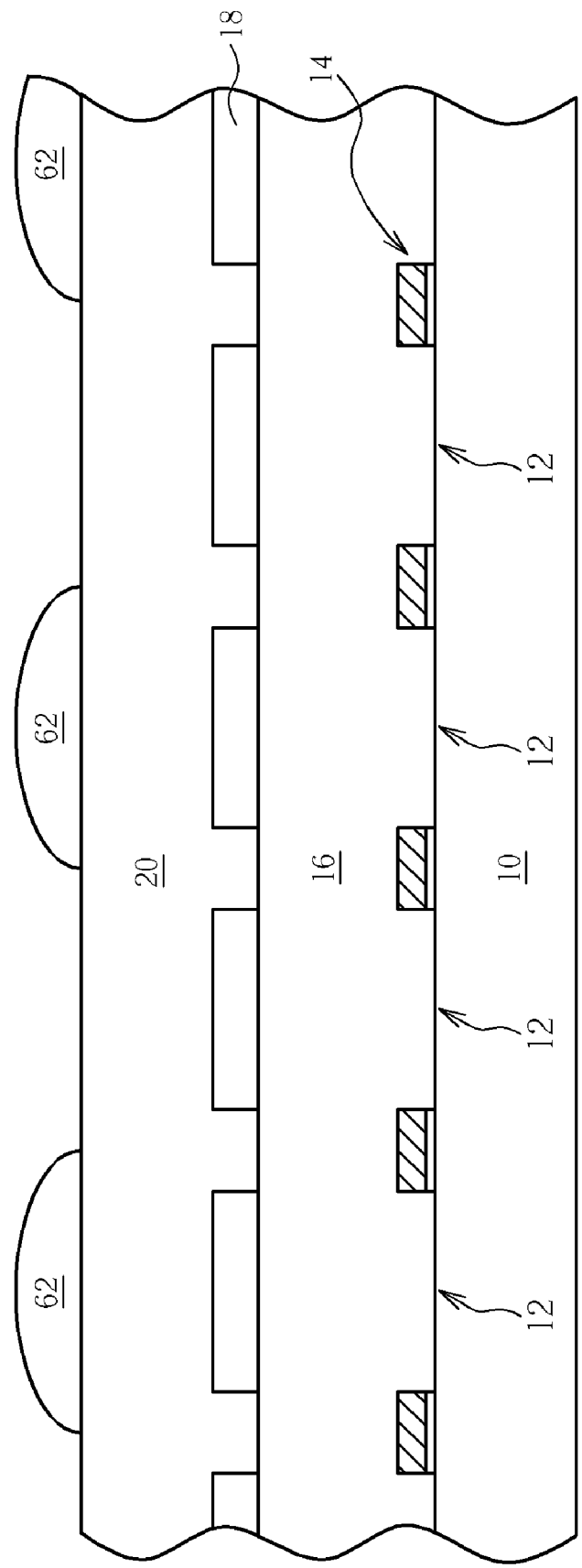
Figure 7:
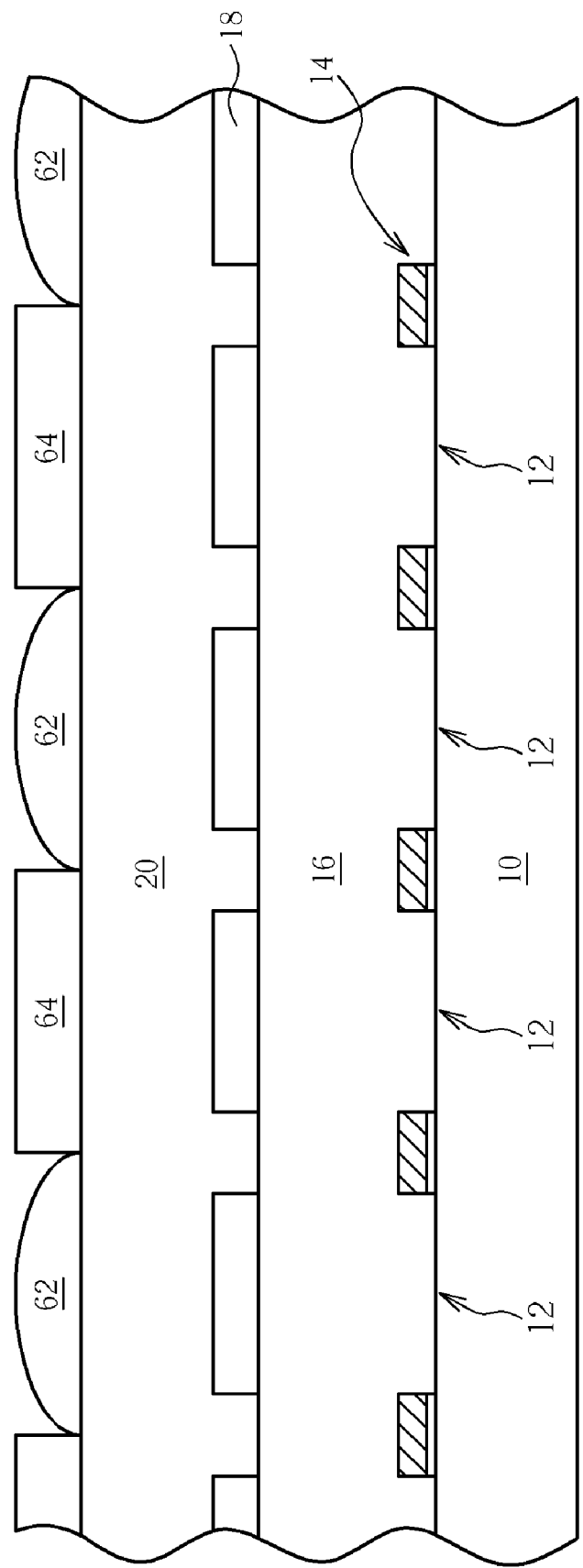
Figure 8:
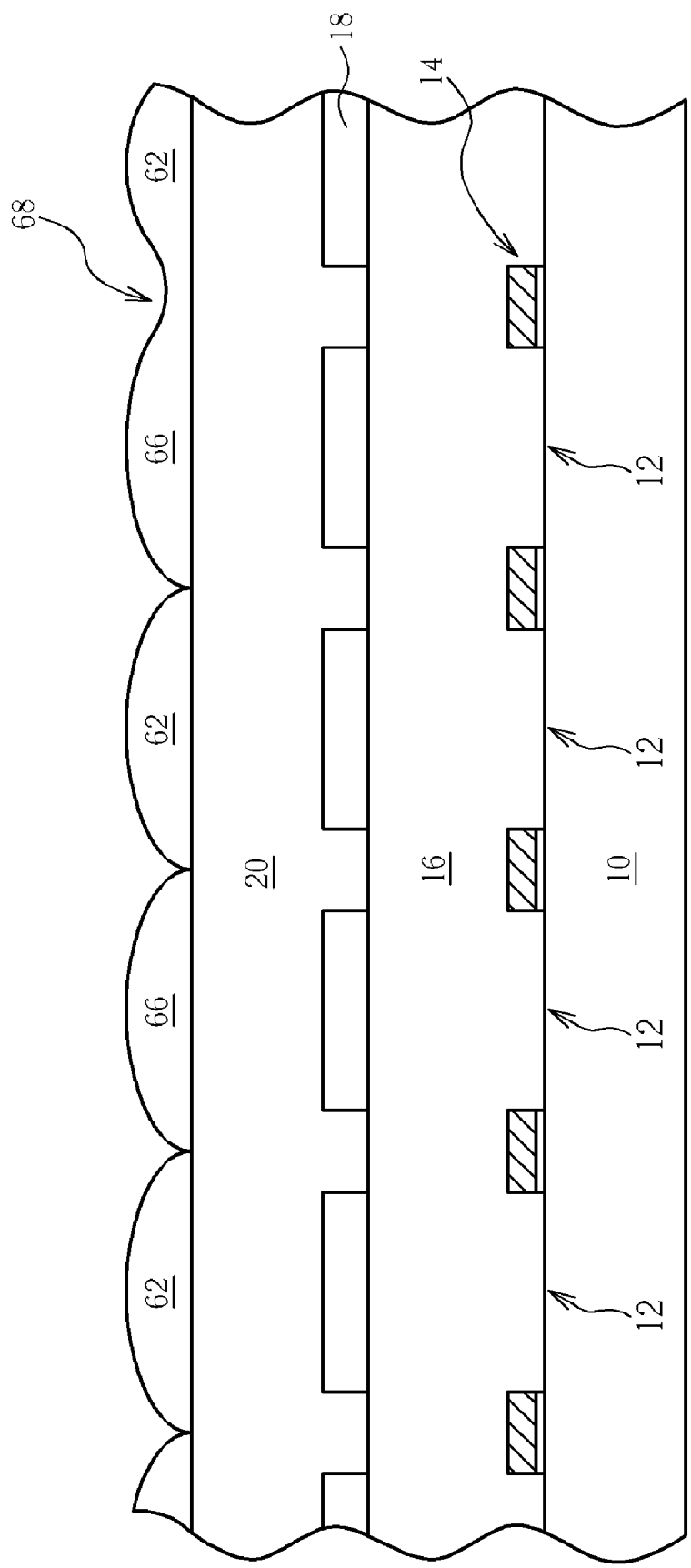
Figure 9:
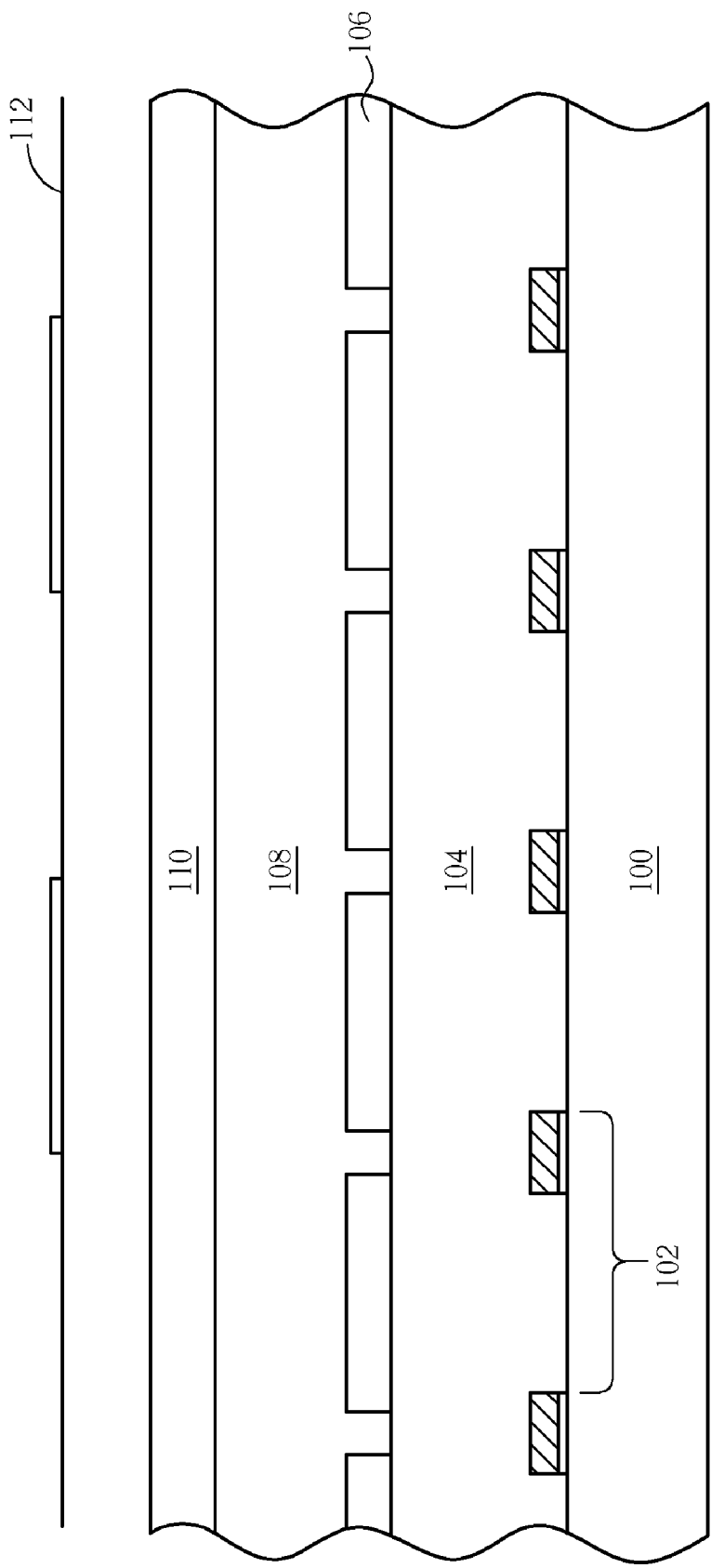
FIGS. 9-16 are schematic drawings illustrating a first preferred embodiment provided by the present invention.

Please refer to FIGS. 9-17, which are schematic drawings illustrating a first preferred embodiment provided by the present invention. As shown in FIG. 9, a semiconductor substrate 100 including a plurality of image sensors 102 such as CCD or CMOS image sensors is provided. Then a transparent dielectric layer 104 and a color filter array (CFA) 106 are sequentially formed on the semiconductor substrate 100. Each of the color filter units of the CFA 106 corresponds to one image sensor 102. And a transparent planarization layer 108 having a thickness of 500 angstroms is formed on the CFA 106. Then, a first micro-lens material layer 110 composed of photoresist is formed on the planarization layer 108.

Figure 10:
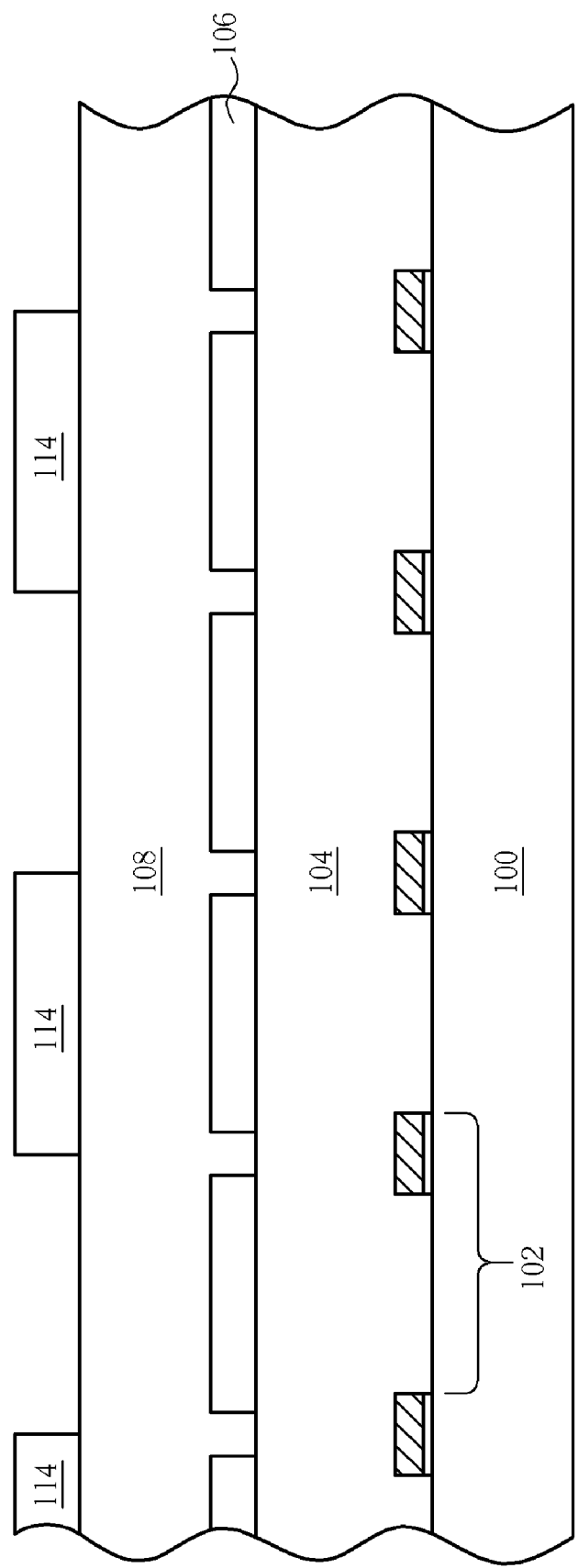

Please refer to FIGS. 9-10. Next, a first photolithography process is performed to pattern the first micro-lens material layer 110 with a chessboard photomask 112. Thus a first set of micro-lens blocks 114 is formed as shown in FIG. 10.

Figure 11:
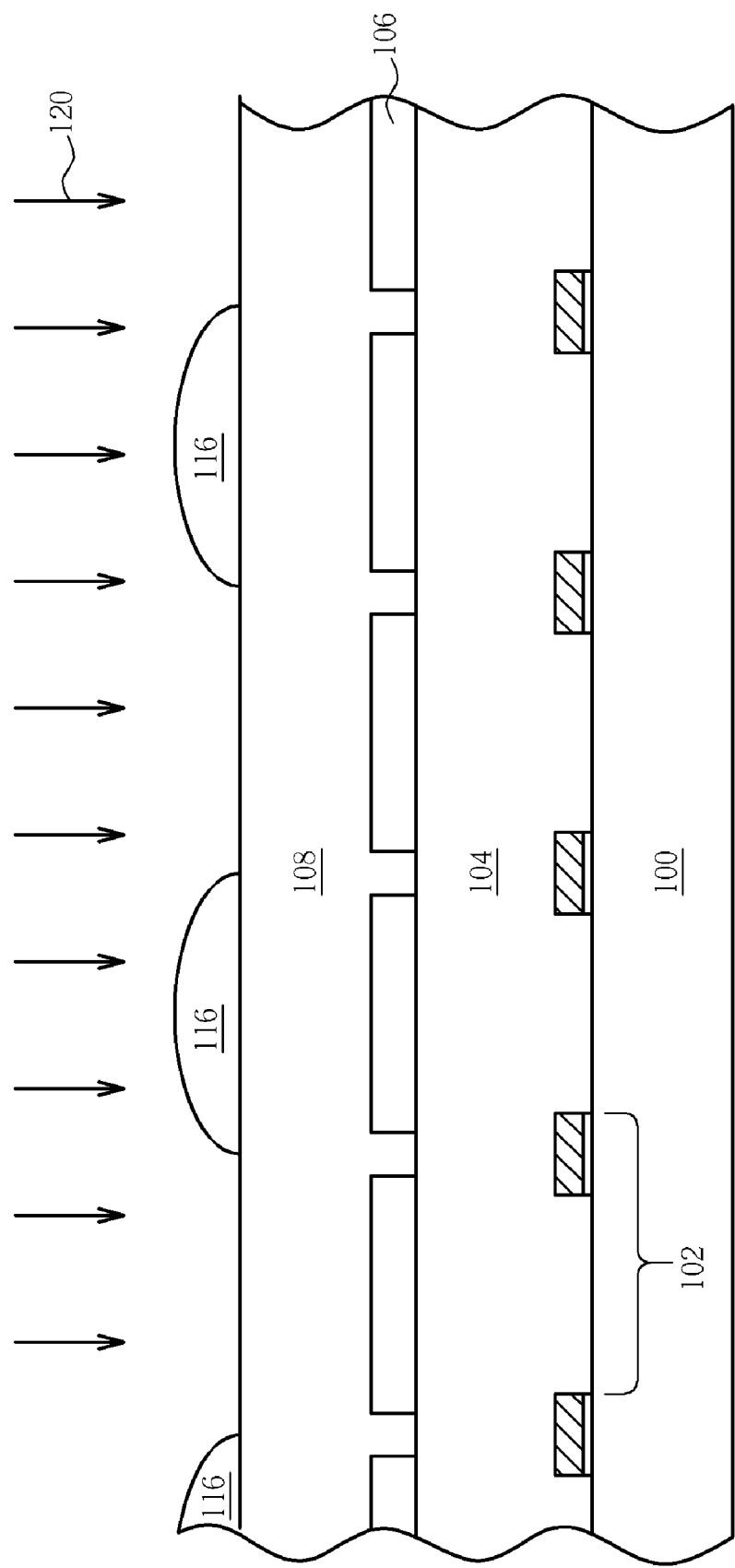

Please refer to FIG. 11. By performing a first baking process to melt and re-shape the first set of micro-lens blocks 114, a first set of micro-lenses 116 is formed. Then a surface treatment 120 is performed to harden surfaces of the first set of micro-lenses 116. After the surface treatment, the first set of micro-lenses 116 possesses strong surfaces which protects itself from influence caused in following processes.

The surface treatment 120 includes a de-scum treatment, an ultraviolet (UV) curing treatment, a bleach treatment, or a chemical solvent treatment, etc. For example, the UV curing treatment is performed by irradiating the first set of micro-lenses 116 with a UV light from a UV source; and the bleach treatment is performed by exposing the first set of micro-lenses 116 in a stepper. The chemical solvent treatment is performed by treating the surfaces of the first set of micro-lenses 116 with N-Methly-2-Pyrrolidone (NMP) and acetone. The de-scum treatment is performed by treating the surfaces of the first set of micro-lenses 116 with an oxygen plasma.

Figure 12:
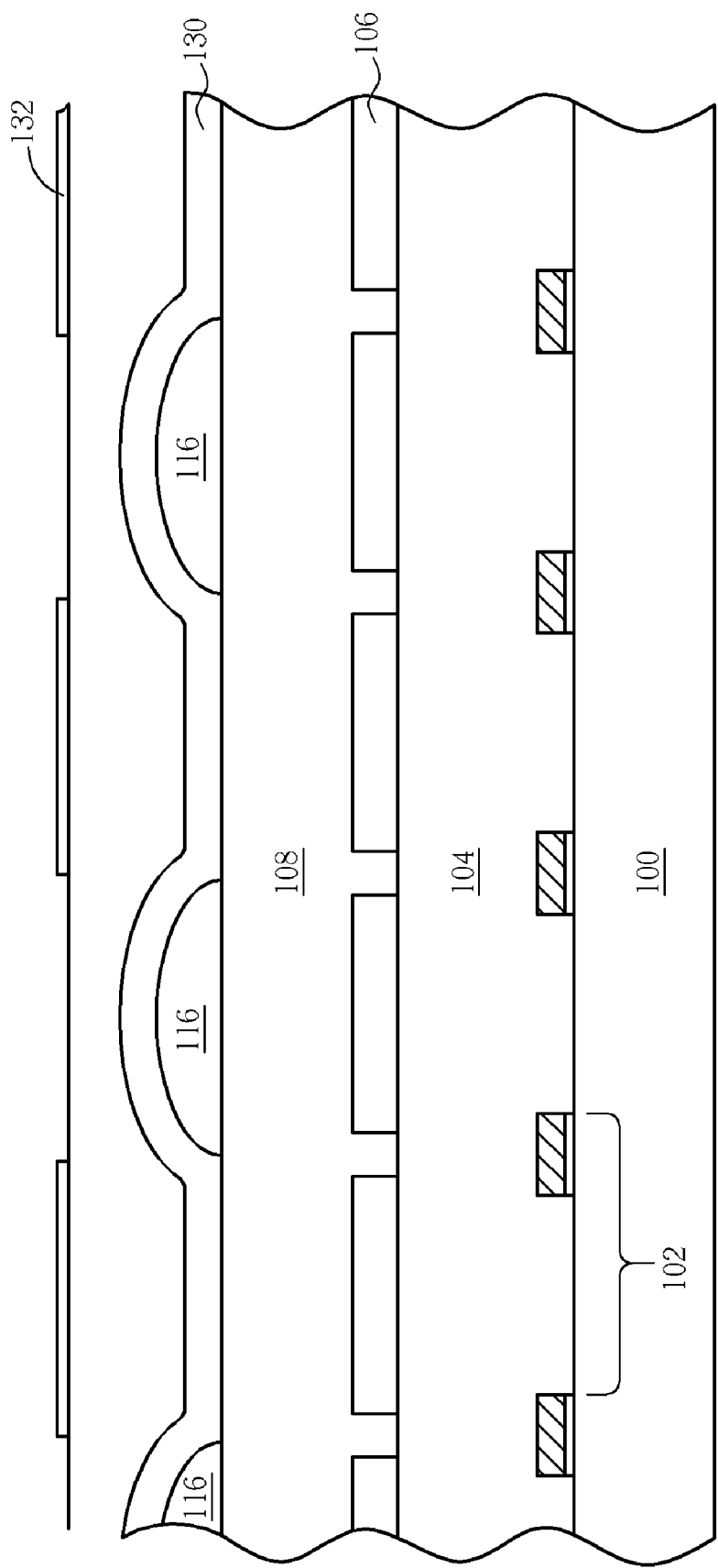
Figure 13:
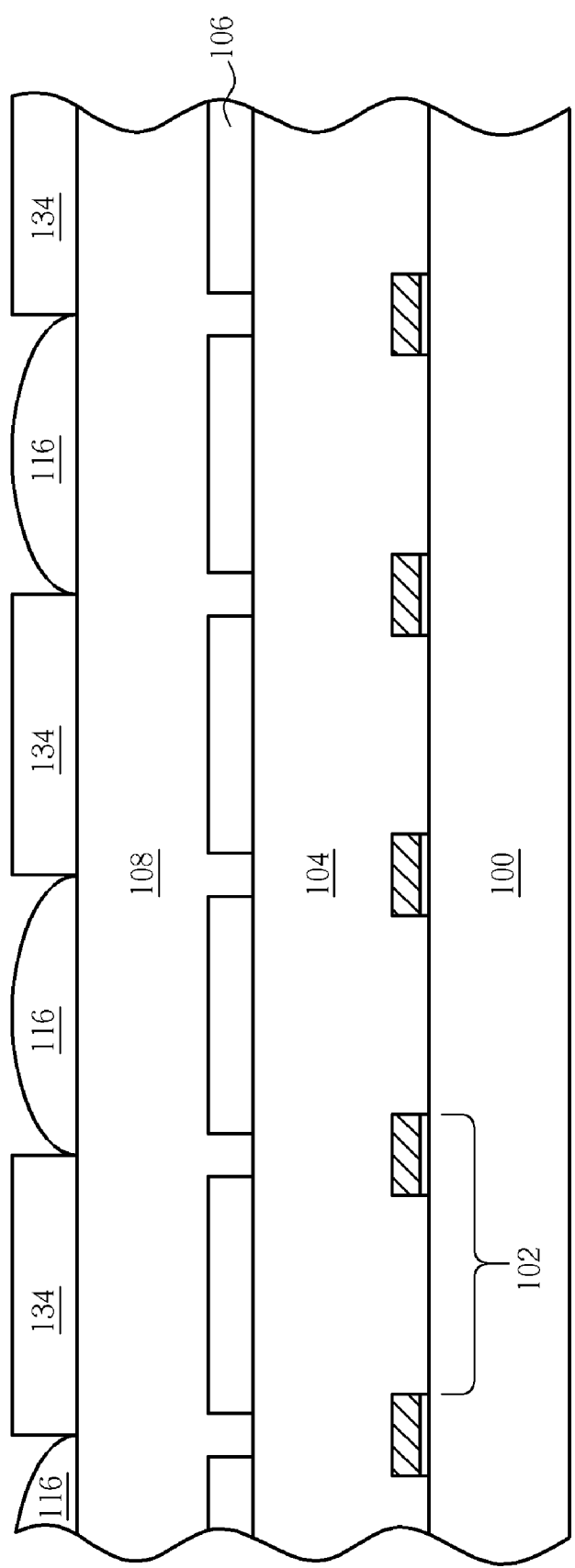

Please refer to FIGS. 12-13. Then, a second micro-lens material layer 130 is formed on the planarization layer 108. And a second photolithography process is performed to pattern the second micro-lens material layer 130 with a second chessboard photomask 132. Thus a second set of micro-lens blocks 134 is formed as shown in FIG. 13.

It is noteworthy that the first chessboard photomask 112 and the second chessboard photomask 132 are the same photomask: by shifting a pitch of the first chessboard photomask 112, the first chessboard photomask 112 can be used in the second photolithography process. In other words, the first set of micro-lens blocks 114 and the second set of micro-lens blocks 134 are two corresponding array patterns differing in one pitch.

Figure 14:
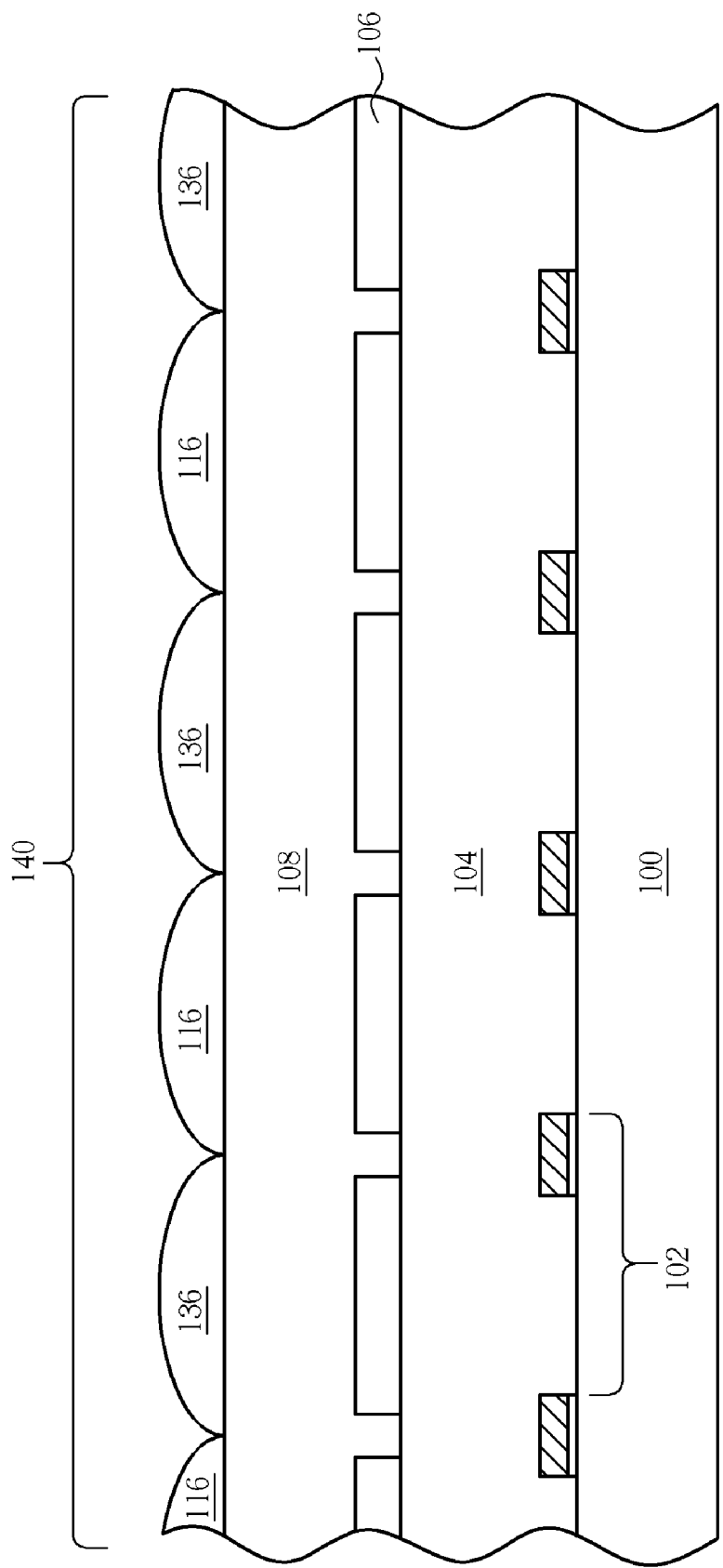

Please refer to FIG. 14. Then a second baking process is performed to melt and re-shape the second set of micro-lens blocks 134. Thus a second set of micro-lenses 136 are formed and a zero-gap micro-lenses array 140 is obtained. Since the surfaces of the first set of micro-lenses 116 have been treated and hardened by the surface treatment, it is protected from influence, such as temperature in the second baking process. Therefore surface profile of the first set of micro-lenses 116 is protected.

Figure 15:
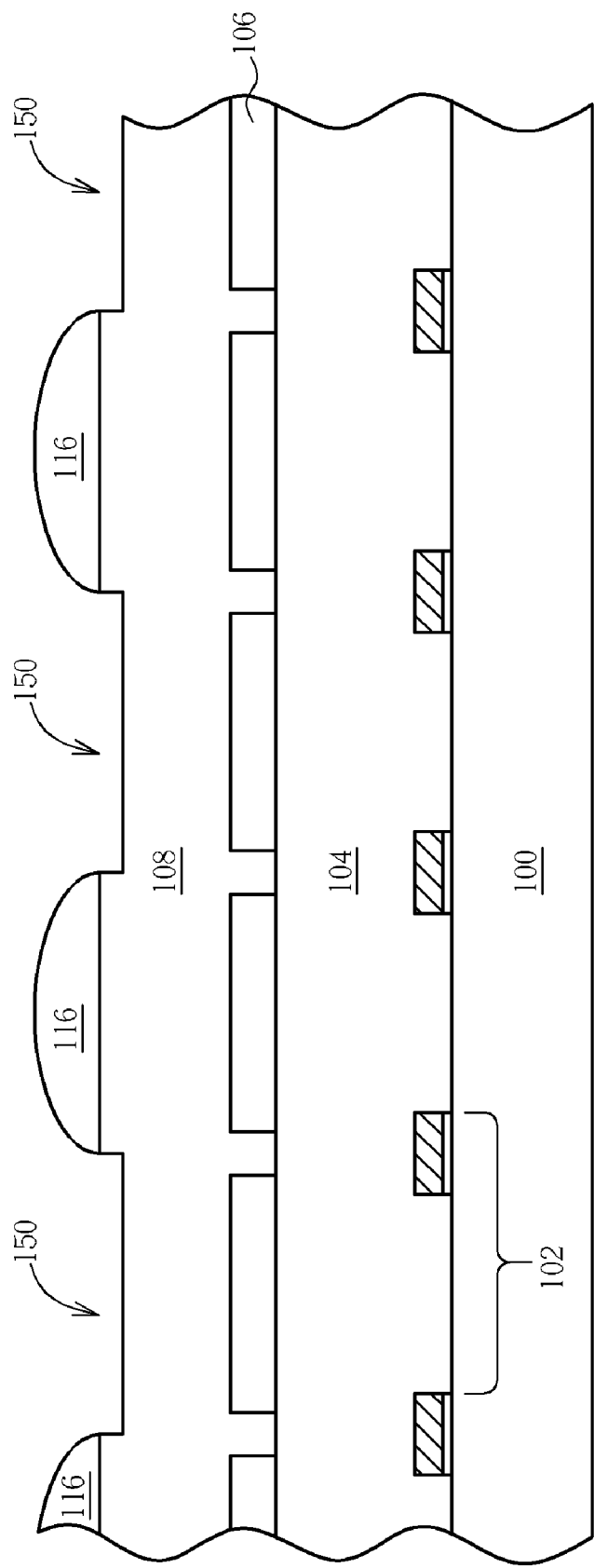
Figure 16:
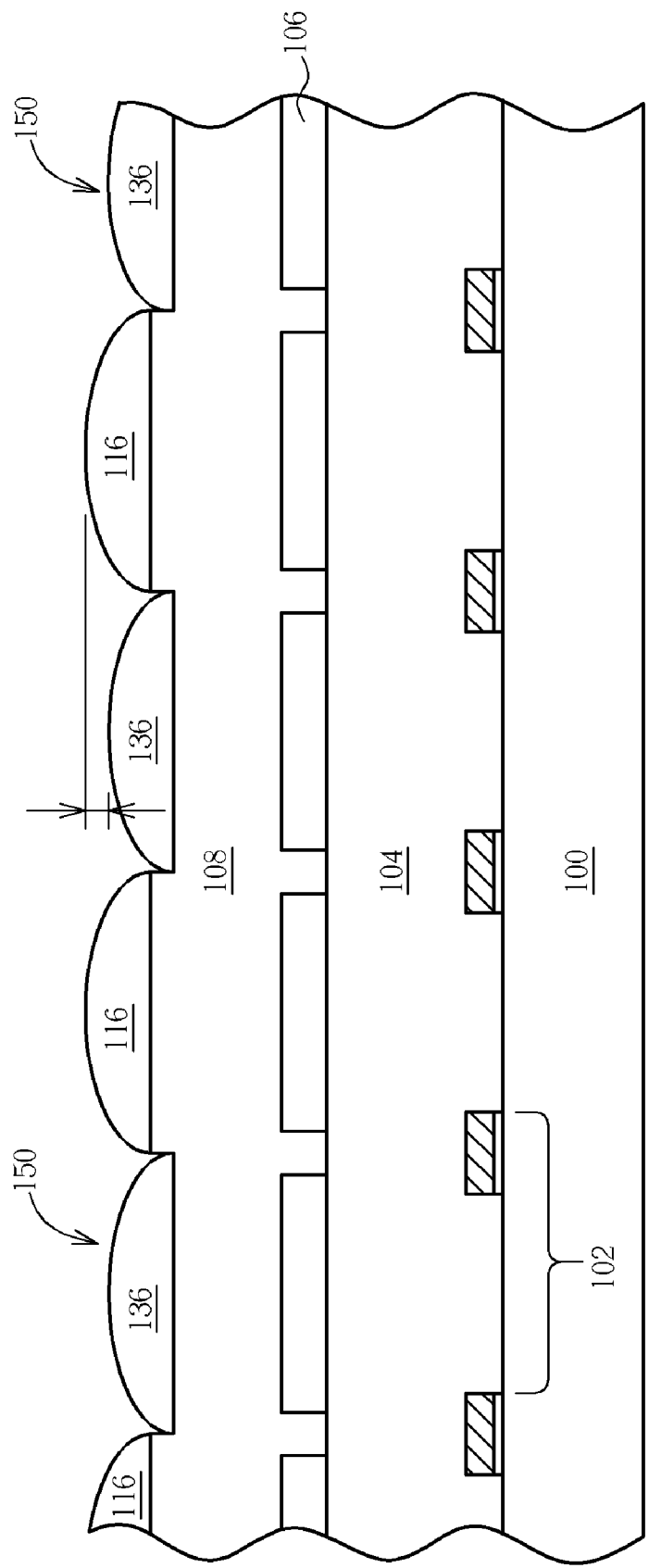

Please refer to FIGS. 15-16. When the first set of micro-lenses 116 and the second set of micro-lenses 136 are of the same height, a mirror effect is generated, therefore reflectivity is increased and incident light is reduced. To avoid such problem, a thickness of the first micro-lens material layer 110 and a thickness of the second micro-lens material layer 130 are adjustable to obtain the first set of micro-lenses 116 and the second set of micro-lenses 136 in different heights. Additionally, the de-scum treatment can be used to etch the planarization layer 108 to form ditches as shown in FIG. 15 simultaneously with treating the first set of micro-lenses 116 by adjusting process parameters such as performing period. The depth of the ditch is about 200-1000 angstroms. Then steps for forming the second set of micro-lenses 136 are performed. Since those steps are the same as above mentioned, those details are omitted in the interest of brevity. As shown in FIG. 16, the height difference between the first set of micro-lenses 116 and the second set of micro-lenses 136 can be adjusted by forming the ditch during the de-scum treatment, thus an uneven surface of the micro-lenses array 140 is obtained and reflectivity is reduced, which means the photosensitivity of the image sensors 102 is relatively improved.

Accordingly, the method for manufacturing micro-lenses of image sensors provided by the first preferred embodiment is to form a micro-lenses array by shifting one chessboard photomask with a pitch. The formed micro-lenses array is a zero-gap micro-lenses array comprising two sets of micro-lenses having corresponding patterns. Comparing with the conventional method for manufacturing micro-lenses, the present invention requires only one photomask. As mentioned above, since the chessboard photomask is a high-grade photomask, the present invention effectively reduces cost in processes. Secondly, since the surface treatment 120 is performed to harden surfaces of the first set of micro-lenses 116, the surfaces of the first set of micro-lenses 116 are protected from influence caused in following processes, and bridges formed in between the first set of micro-lenses 116 and the second set of micro-lenses 136 are avoided. Therefore surface profile of the micro-lenses array is protected. In summary, the method provided by the present invention not only simplifies the process and reduces cost, but also improves completeness of the micro-lenses array.

Figure 17:
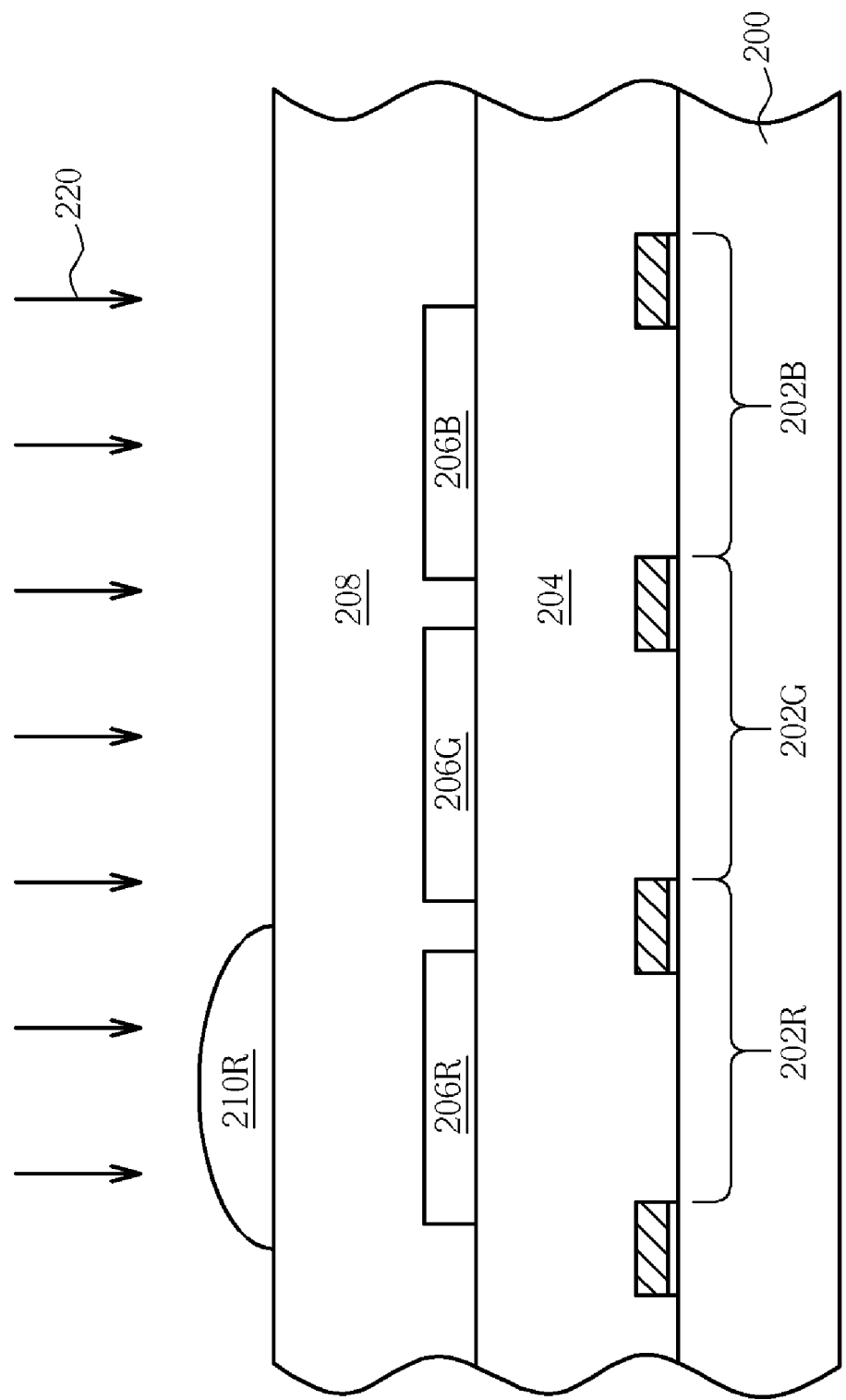
FIGS. 17-19 are schematic drawings illustrating a second preferred embodiment provided by the present invention.

Furthermore, since image sensors have different photosensitivity requirements for lights in different wavelengths, the method provided by the present invention is used to form sets of micro-lenses in same or in different height according to requirement in R/G/B image sensors. Please refer to FIGS. 17-19, which are schematic drawings illustrating a second preferred embodiment provided by the present invention. As shown in FIG. 17, a semiconductor substrate 200 including a plurality of image sensors 202R, 202G, 202B such as CCD or CMOS image sensors is provided. Then a transparent dielectric layer 204 and a color filter array (CFA) 206 are sequentially formed on the semiconductor substrate 200. The color filter units 206R, 206G, 206B of the CFA 206 respectively correspond to image sensor 202 R, 202G, 202B. And a transparent planarization layer 208 having a thickness of 500 angstroms is formed on the CFA 206.

Please refer to FIG. 17 again. A first photolithography process is performed to form a first set of micro-lens blocks (not shown) with a first chessboard photomask (not shown). And a first baking process is performed to form a first set of micro-lenses 210R respectively corresponding to the color filter units 206R. Since steps for forming the first set of micro-lenses 210R are similar with steps mentioned above, those steps are omitted in the interest of brevity. In the same concept, steps for forming a second set of micro-lenses 210G and a third set of micro-lenses 210B are both omitted. After forming the first set of micro-lenses 210R, a first surface treatment 220 is performed to harden surfaces of the first set of micro-lenses 210R.

Figure 18:
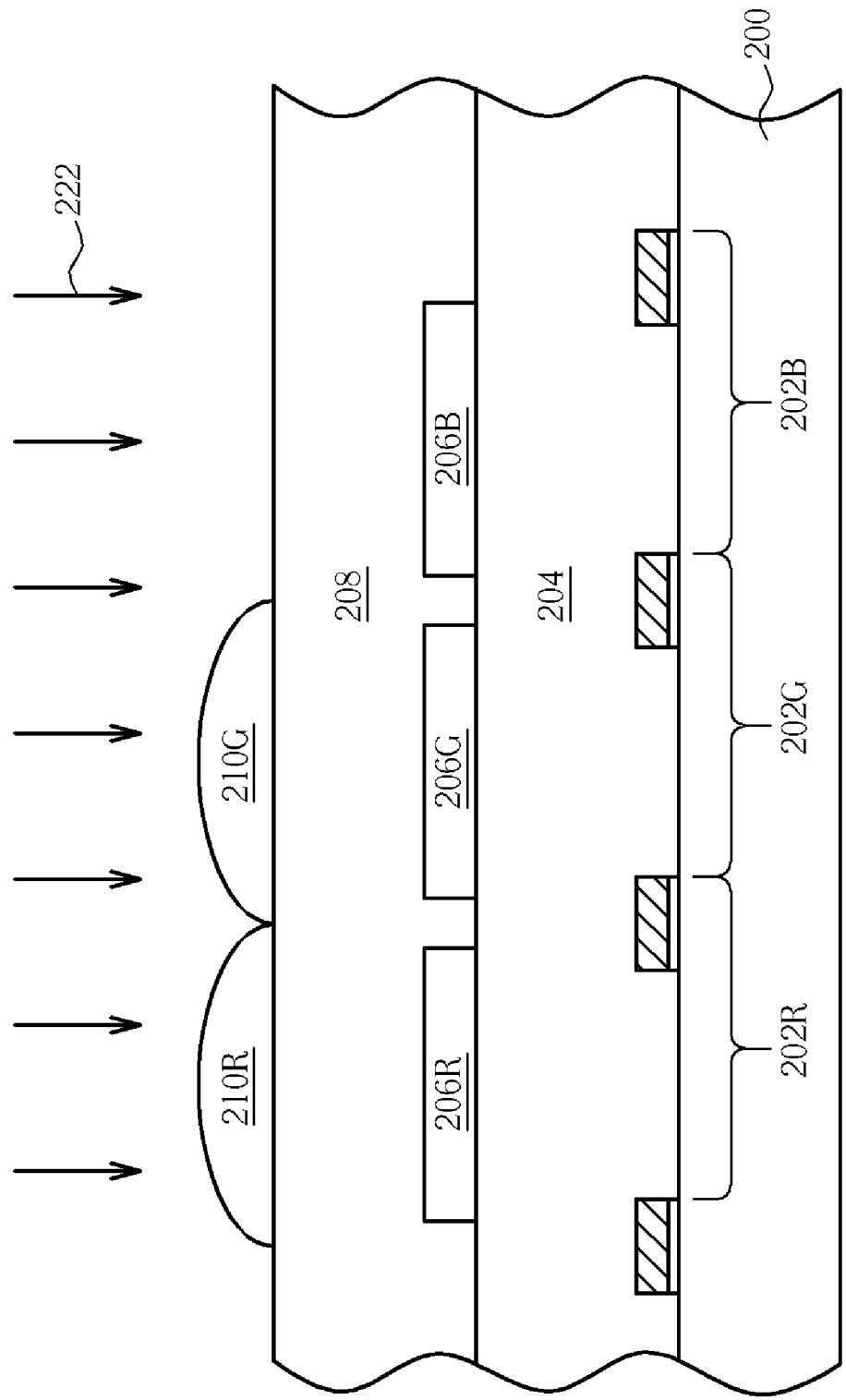

Please refer to FIG. 18. Next, a second photolithography process is performed to form a second set of micro-lens blocks (not shown) with a second chessboard photomask (not shown). And a second baking process is performed to form a second set of micro-lenses 210G respectively corresponding to the color filter units 206G. After forming the second set of micro-lenses 210G, a second surface treatment 222 is performed to harden surfaces of the second set of micro-lenses 210G.

Figure 19:
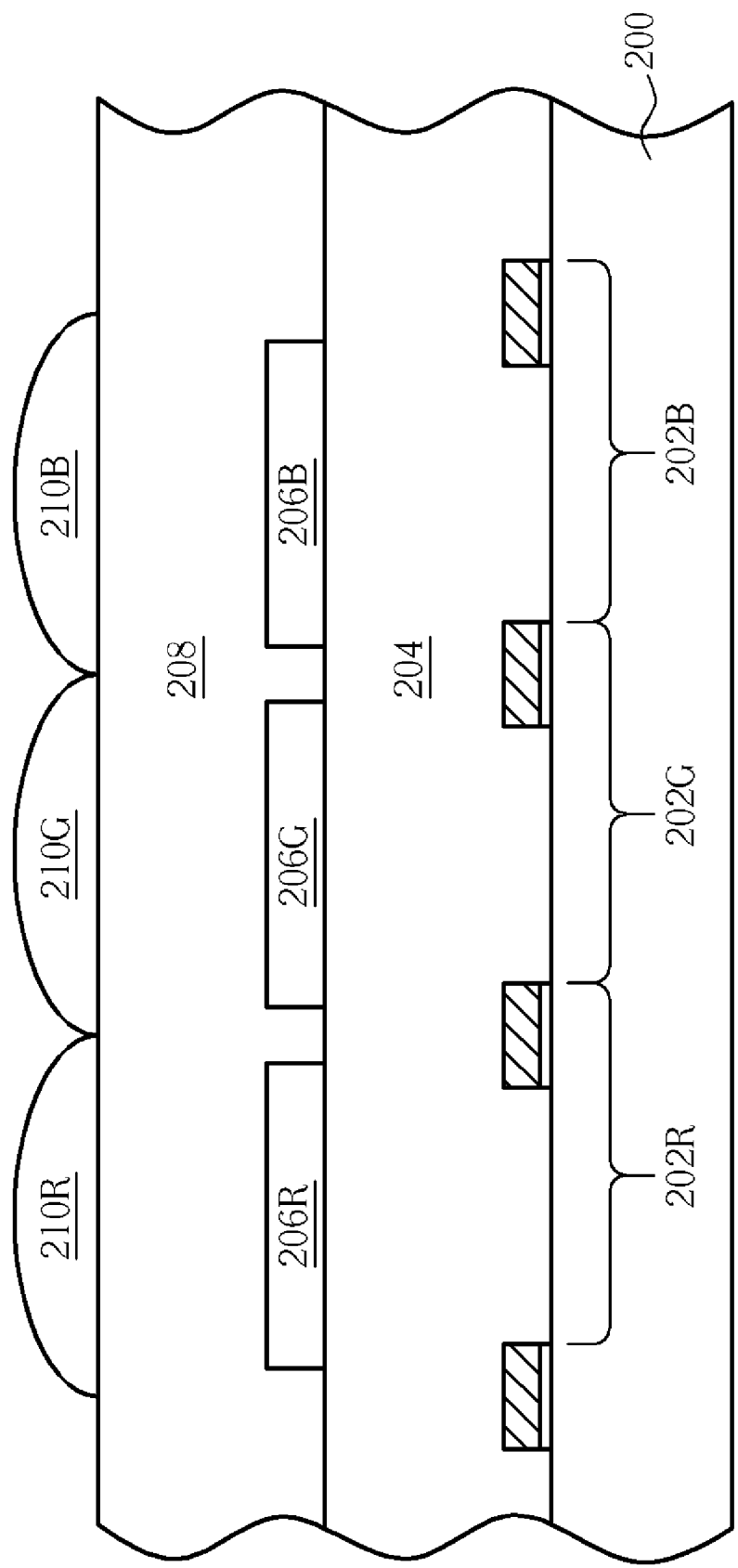

Please refer to FIG. 19. Then, a third photolithography process is performed to form a third set of micro-lens blocks (not shown) with a third chessboard photomask (not shown). And a third baking process is performed to form a third set of micro-lenses 210B respectively corresponding to the color filter units 206B. Thus a zero-gap micro-lenses array 210 is obtained.

The first surface treatment 220 and the second surface treatment 222 comprise de-scum treatments, UV curing treatments, bleach treatments, or chemical solvent treatments. For example, the UV curing treatment is performed by irradiating the first set of micro-lenses 210R or the second set of micro-lenses 210G with a UV light from a UV source; and the bleach treatment is performed by exposing the first set of micro-lenses 210R or the second set of micro-lenses 210G in a stepper. The chemical solvent treatments comprise N-Methly-2-Pyrrolidone (NMP) and acetone. And the de-scum treatments are performed by treating the surfaces of the first set of micro-lenses 210R or the second set of micro-lenses 210G with an oxygen plasma.

As mentioned above, by adjusting process parameters such as performing period of the de-scum treatment, the planarization layer 208 can be etched to form ditches (not shown) simultaneously with hardening the surfaces of the first set of micro-lenses 210R or the second set of micro-lenses 210G. A thickness of the ditch is about 200-100 angstroms. The ditches are used to adjust a height of the second set of micro-lenses 210G or a height of the third set of micro-lenses 210B. Therefore the micro-lenses array possesses an uneven surface, which reduces reflectivity and relatively improves photosensitivity. In addition, heights, sizes and orders for forming the first set of micro-lenses 210R, the second set of micro-lenses 210G, and third set of micro-lenses 210B are not limited by the specification and the drawings.

According to the method provide by the second preferred embodiment, a first surface treatment 220 is performed between forming the first set of micro-lenses 210R and forming the second set of micro-lenses 210G, and a second surface treatment 222 is performed between forming the second set of micro-lenses 210G and third set of micro-lenses 210B, therefore surfaces of each set of micro-lenses are protected from influence caused in following processes, and bridges formed in between each set of micro-lenses are avoided. Thus surface profile of the micro-lenses array is protected. In addition, ditches formed in the de-scum treatment and served to adjust heights of the micro-lenses not only reduce reflectivity, but also are used to form micro-lenses satisfying requirements of the image sensor for lights in different wavelengths.

In summary, the method provided by the present invention is used to form micro-lenses set by set; therefore a zero-gap micro-lens array is obtained. Additionally, since the former set of micro-lenses is hardened by a surface treatment before performing steps for forming the next set of micro-lenses, it is protected from influence caused in following processes, and bridges formed in between each set of micro-lenses are avoided. Thus completeness of surface profile of each set of micro-lenses is further improved.

Those skilled in the art will readily observe that numerous modifications and alterations of the device and method may be made while retaining the teachings of the invention.

What is claimed is:

1. A method for manufacturing micro-lenses of image sensors comprising steps of:
   providing a semiconductor substrate having at least a planarization layer;
   performing a first photolithography process to form a first set of micro-lens blocks on the planarization layer;
   performing a first baking process to form a first set of micro-lenses on the planarization layer;
   performing a first surface treatment comprising a de-scum treatment, a bleach treatment, or a chemical solvent treatment to harden surfaces of the first set of micro-lenses;
   performing a second photolithography process to form a second set of micro-lens blocks on the planarization layer; and
   performing a second baking process to form a second set of micro-lenses on the planarization layer.

2. The method of claim 1, wherein the first photolithography process further comprises:
   forming a first micro-lens material layer on the planarization layer; and
   performing the first photolithography process to pattern the first micro-lens material layer with a first chessboard photomask and form the first set of micro-lens blocks.

3. The method of claim 2, wherein the second photolithography process further comprises:
   forming a second micro-lens material layer on the planarization layer; and
   performing the second photolithography process to pattern the second micro-lens material layer with a second chessboard photomask and to form the second set of micro-lens blocks.

4. The method of claim 3, wherein the first chessboard photomask and the second chessboard photomask are the same photomask.

5. The method of claim 4, wherein the first set of micro-lens blocks and the second set of micro-lens blocks are two corresponding array patterns differing in one pitch.

6. The method of claim 1, wherein the de-scum treatment comprises an oxygen plasma.

7. The method of claim 6, wherein the oxygen plasma is used to etch the planarization layer to form a plurality of ditches respectively in between each of the first set of micro-lenses.

8. The method of claim 7, wherein a depth of the ditch is 200-1000 angstroms.

9. The method of claim 1, wherein the chemical solvent treatment comprises N-Methly-2-Pyrrolidone (NMP) and acetone.

10. The method of claim 1, wherein the first set of micro-lenses and the second set of micro-lenses are of the same height.

11. The method of claim 1, wherein a height of the first set of micro-lenses is different from a height of the second set of micro-lenses.

12. The method of claim 1, wherein the first set of micro-lenses and the second set of micro-lenses respectively correspond to a color filter array positioned on the semiconductor substrate.

13. The method of claim 1 further comprising a step of performing a second surface treatment to harden surfaces of the second set of micro-lenses after the second baking process.

14. The method of claim 13, wherein the second surface treatment comprises a de-scum treatment, a UV curing treatment, a bleach treatment, or a chemical solvent treatment.

15. The method of claim 13 further comprising steps of forming a third set of the micro-lenses after the second surface treatment, the steps comprising:
    forming a third micro-lens material layer on the planarization;
    forming a third set of micro-lens blocks with a third chessboard photomask; and
    performing a third baking process to form the third set of micro-lenses.

16. The method of claim 15, wherein the first set of micro-lenses, the second set of micro-lenses, and the third set of micro-lenses are of the same height.

17. The method of claim 15, wherein a height of the first set of micro-lenses, a height of the second set of micro-lenses, and a height of the third set of micro-lenses are different from each other.

18. The method of claim 15, wherein the first set of micro-lenses, the second set of micro-lenses, and the third set of micro-lenses respectively correspond to a color filter array positioned on the semiconductor substrate.

19. A method for manufacturing micro-lenses of image sensors comprising steps of:
    providing a semiconductor substrate having at least a planarization layer;
    performing a first photolithography process to form a first set of micro-lens blocks on the planarization layer with a first chessboard photomask;
    performing a first baking process to form a first set of micro-lenses on the planarization layer;
    performing a surface treatment comprising a de-scum treatment, a bleach treatment, or a chemical solvent treatment to harden surfaces of the first set of micro-lenses;
    performing a second photolithography process to form a second set of micro-lens blocks with the first chessboard photomask shifted one pitch, wherein the first set of micro-lens blocks and the second set of micro-lens blocks are two corresponding array patterns differing in one pitch; and
    performing a second baking process to form a second set of micro-lenses on the planarization layer.

20. The method of claim 19, wherein the first photolithography process further comprises:
    forming a first micro-lens material layer on the planarization layer; and
    performing the first photolithography process to pattern the first micro-lens material layer with the first chessboard photomask and form the first set of micro-lens blocks on the planarization layer.

21. The method of claim 19, wherein the second photolithography process further comprises:
    forming a second micro-lens material layer on the planarization layer; and
    performing the second photolithography process to pattern the second micro-lens material layer with the first chessboard photomask and to form the second set of micro-lens blocks.

22. The method of claim 19, wherein the de-scum treatment comprises an oxygen plasma.

23. The method of claim 22, wherein the oxygen plasma is used to etch the planarization layer to form a plurality of ditches respectively in between each of the first set of micro-lenses.

24. The method of claim 23, wherein a depth of the ditch is 200-1000 angstroms.

25. The method of claim 19, wherein the chemical solvent treatment comprises N-Methly-2-Pyrrolidone (NMP) and acetone.

26. The method of claim 19, wherein the first set of micro-lenses and the second set of micro-lenses are of the same height.

27. The method of claim 19, wherein a height of the first set of micro-lenses is different from a height of the second set of micro-lenses.

28. The method of claim 19, wherein the first set of micro-lenses and the second set of micro-lenses respectively correspond to a color filter array positioned on the semiconductor substrate.

* * * * *